(12) United States Patent
Castro et al.

(10) Patent No.: US 10,803,937 B2
(45) Date of Patent: *Oct. 13, 2020

(54) OPERATIONAL SIGNALS GENERATED FROM CAPACITIVE STORED CHARGE

(71) Applicant: Micron Technology, Inc., Boise, ID (US)

(72) Inventors: Hernan A. Castro, Shingle Springs, CA (US); Jeremy M. Hirst, Orangevale, CA (US); Eric S. Carman, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/533,208

(22) Filed: Aug. 6, 2019

(65) Prior Publication Data

US 2019/0362788 A1 Nov. 28, 2019

Related U.S. Application Data

(63) Continuation of application No. 15/646,903, filed on Jul. 11, 2017, now Pat. No. 10,424,371, which is a continuation of application No. 14/477,527, filed on Sep. 4, 2014, now Pat. No. 9,711,213.

(51) Int. Cl.
*G11C 13/00* (2006.01)

(52) U.S. Cl.
CPC ........ *G11C 13/0038* (2013.01); *G11C 13/003* (2013.01); *G11C 13/0004* (2013.01); *G11C 13/0023* (2013.01); *G11C 13/0069* (2013.01)

(58) Field of Classification Search
CPC ............ G11C 13/0038; G11C 13/0004; G11C 13/0023; G11C 13/003; G11C 13/0069
USPC ......................................................... 365/163
See application file for complete search history.

(56) References Cited

U.S. PATENT DOCUMENTS

| 4,961,002 A * | 10/1990 | Tam ..................... G06N 3/063 365/185.03 |
| 5,028,810 A | 7/1991 | Castro et al. |
| 5,412,614 A | 5/1995 | Bird |
| 6,188,615 B1 * | 2/2001 | Perner .................... G11C 7/067 365/158 |
| 6,625,054 B2 | 9/2003 | Lowrey et al. |
| 7,830,729 B2 | 11/2010 | Baker |
| 7,986,549 B1 * | 7/2011 | Tang .................. G11C 13/0004 365/163 |

(Continued)

OTHER PUBLICATIONS

U.S. Appl. No. 14/477,527 U.S. Pat. No. 9,711,213, filed Sep. 4, 2014, Operational Signals Generated from Capacitive Stored Charge.

(Continued)

*Primary Examiner* — Sung Il Cho
(74) *Attorney, Agent, or Firm* — Schwegman Lundberg & Woessner, P.A.

(57) ABSTRACT

Methods, a memory device, and a system are disclosed. One such method includes providing a first pulse to one of multiple bit lines of a variable resistance memory structure at a first time using a first transistor, a second pulse to the one of the multiple bit lines at a second time later than the first time using the first transistor, and a third pulse to the one of the multiple bit lines at a third time later than the second time using a second transistor.

23 Claims, 6 Drawing Sheets

(56) References Cited

U.S. PATENT DOCUMENTS

| | | |
|---|---|---|
| 8,199,566 B1 | 6/2012 | Fackenthal et al. |
| 8,917,534 B2 * | 12/2014 | Castro ................ G11C 13/0028 |
| | | 365/148 |
| 8,934,280 B1 | 1/2015 | Kuo et al. |
| 8,975,610 B1 | 3/2015 | Mathur et al. |
| 9,142,271 B1 | 9/2015 | Srinivasan et al. |
| 9,711,213 B2 | 7/2017 | Castro et al. |
| 2006/0002172 A1 | 1/2006 | Venkataraman et al. |
| 2006/0007729 A1 * | 1/2006 | Cho ................... G11C 13/0069 |
| | | 365/163 |
| 2006/0181915 A1 | 8/2006 | Oh et al. |
| 2006/0181922 A1 | 8/2006 | Dodge et al. |
| 2006/0227591 A1 | 10/2006 | Lowrey et al. |
| 2008/0112217 A1 | 5/2008 | Karpov et al. |
| 2008/0291719 A1 | 11/2008 | Fackenthal et al. |
| 2009/0116280 A1 | 5/2009 | Parkinson et al. |
| 2009/0244962 A1 * | 10/2009 | Gordon ................ G11C 13/004 |
| | | 365/163 |
| 2009/0296450 A1 | 12/2009 | Sheu et al. |
| 2009/0300467 A1 | 12/2009 | Parkinson |
| 2009/0323391 A1 * | 12/2009 | Scheuerlein ....... G11C 13/0064 |
| | | 365/148 |
| 2009/0323392 A1 * | 12/2009 | Fasoli ................ G11C 13/0064 |
| | | 365/148 |
| 2009/0323394 A1 * | 12/2009 | Scheuerlein ....... G11C 13/0064 |
| | | 365/148 |
| 2010/0020594 A1 | 1/2010 | De et al. |
| 2010/0046275 A1 | 2/2010 | Hosono et al. |
| 2010/0054017 A1 * | 3/2010 | Maejima ............ G11C 13/0021 |
| | | 365/148 |
| 2010/0142256 A1 * | 6/2010 | Kumar .................. B82Y 10/00 |
| | | 365/148 |
| 2010/0232205 A1 * | 9/2010 | Parkinson ............ G11C 13/004 |
| | | 365/148 |
| 2010/0309716 A1 * | 12/2010 | Tsukada ................ H02M 3/073 |
| | | 365/163 |
| 2010/0321978 A1 | 12/2010 | Inoue |
| 2011/0134685 A1 | 6/2011 | Kau et al. |
| 2011/0235397 A1 | 9/2011 | Sasaki et al. |
| 2012/0014164 A1 | 1/2012 | Kamoshida et al. |
| 2012/0026786 A1 * | 2/2012 | Castro ................ G11C 13/0069 |
| | | 365/163 |
| 2012/0250393 A1 | 10/2012 | Shirakawa |
| 2013/0051137 A1 * | 2/2013 | Zeng ................... G11C 13/0061 |
| | | 365/163 |
| 2013/0314984 A1 | 11/2013 | Scoville et al. |
| 2014/0071748 A1 * | 3/2014 | Li ...................... G11C 13/0069 |
| | | 365/163 |
| 2014/0104923 A1 * | 4/2014 | Baek .................. G11C 13/0007 |
| | | 365/148 |
| 2014/0140128 A1 | 5/2014 | Jurasek |
| 2014/0169089 A1 * | 6/2014 | Castro ................ G11C 13/0038 |
| | | 365/163 |
| 2015/0039547 A1 * | 2/2015 | Kang .................... G06N 3/063 |
| | | 706/42 |
| 2015/0055407 A1 | 2/2015 | Mantegazza et al. |
| 2015/0310912 A1 * | 10/2015 | Park ................... G11C 13/0069 |
| | | 365/148 |
| 2016/0071584 A1 | 3/2016 | Castro et al. |
| 2016/0148678 A1 | 5/2016 | Park |
| 2017/0309333 A1 | 10/2017 | Castro et al. |

OTHER PUBLICATIONS

U.S. Appl. No. 15/646,903, filed Jul. 11, 2017, Operational Signals Generated from Capacitive Stored Charge.

* cited by examiner

OPERATIONAL SIGNALS GENERATED FROM CAPACITIVE STORED CHARGE

PRIORITY APPLICATION

This application is a continuation of U.S. application Ser. No. 15/646,903, filed Jul. 11, 2017, which is a continuation of U.S. application Ser. No. 14/477,527, filed Sep. 4, 2014, now issued as U.S. Pat. No. 9,711,213, each of which are incorporated herein by reference in their entireties.

BACKGROUND

Electronic device manufacturers are under constant pressure to reduce power consumption of mobile electronic devices comprising semiconductor devices (e.g., transistors, memory). This can increase the battery life of the mobile devices.

When semiconductor devices are accessed during an operation (e.g., read operation, write operation), one or more of the access lines are coupled to a power supply in order to generate the desired access signals (e.g., pulses). This can result in undesirable power usage.

There are resulting needs for reducing power consumption during semiconductor device operation.

DETAILED DESCRIPTION

The subsequently illustrated embodiments can provide at least a portion of an operational signal (e.g., pulse) using capacitive energy stored up in a circuit. The capacitive energy can be stored up as a result of another operation or a related operation (e.g., precharging bit lines or word lines). Thus, the operational signal can be generated using energy that would typically be wasted, thereby saving the energy from a power supply typically used to generate the signal.

For purposes of clarity, the following description refers to pulses as the operational signal being generated. One skilled in the art would realize that the definition of "pulse" can refer to multiple types of signals (e.g., ramped signals).

Figure 1:
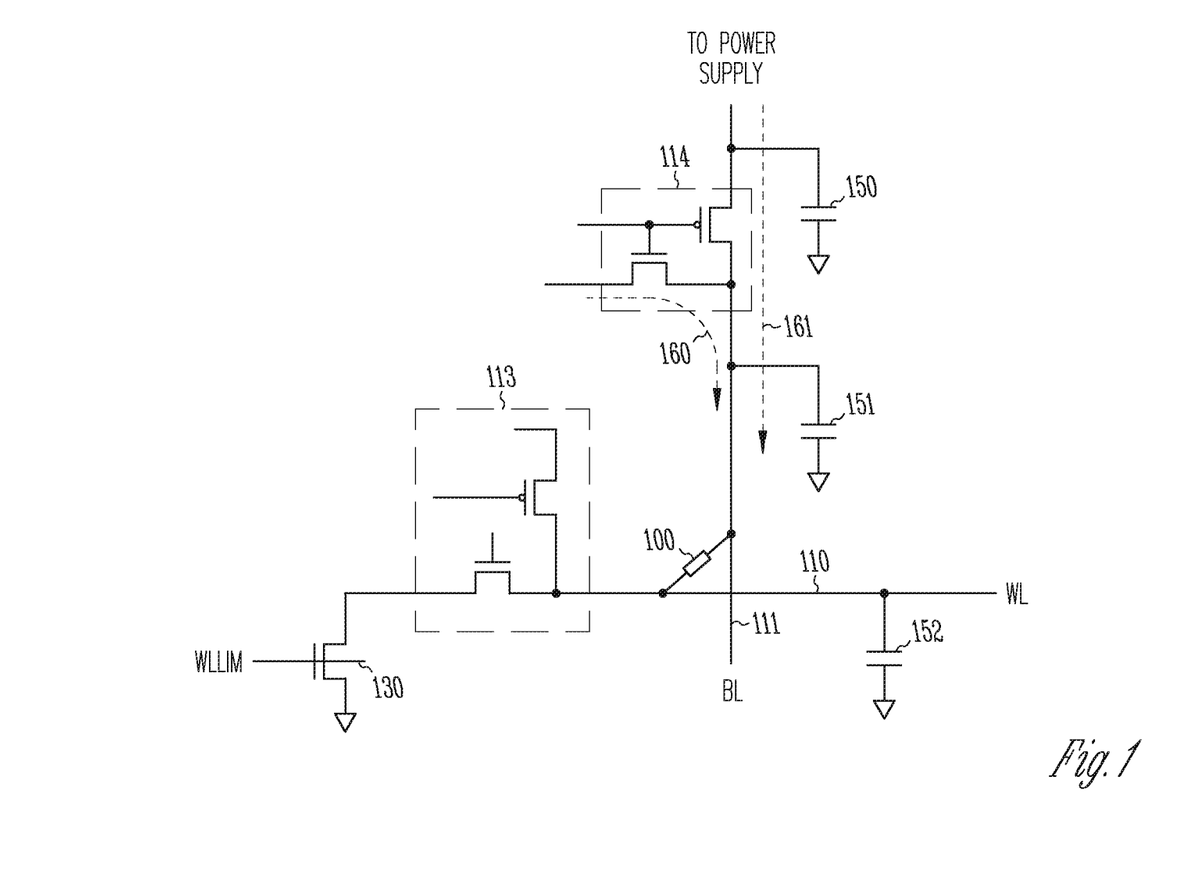
FIG. 1 illustrates a schematic diagram of an embodiment of a memory circuit that can use discharge of capacitive energy to generate operational signals.

FIG. 1 illustrates a schematic diagram of an embodiment of a memory circuit that can use capacitive discharge of previously stored capacitive energy to generate operational signals (e.g., write pulses, erase pulses, read pulses, set pulses, reset pulses). This circuit is for purposes of illustration only as other circuits, both memory and non-memory, can be used to both store and use capacitive discharge to generate various operational signals. The capacitive discharge can be used as the entire pulse or, if the pulse needs more current than can be supplied by the capacitive discharge, a power supply can be switched in to generate a portion of the pulse.

Figure 2:
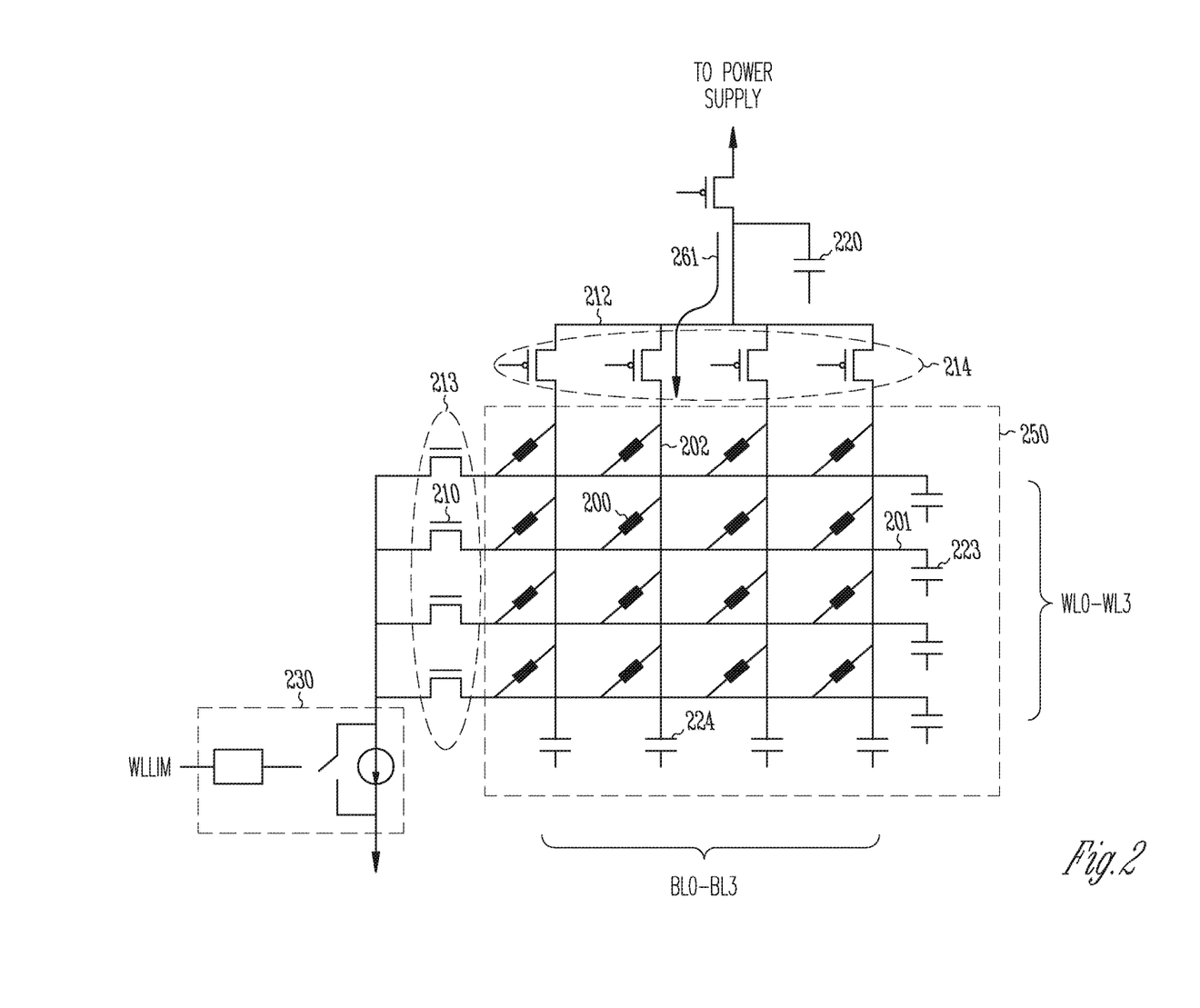
FIG. 2 illustrates a memory array in accordance with the embodiment of FIG. 1.

The circuits of FIGS. 1 and 2 show resistive memory circuits (e.g., chalcogenide glass, phase change memory (PCM)) for purposes of illustration. These memories can be considered cross-point memories since the memory cells are located between access lines (e.g., word lines) and data lines (e.g., bit lines). Cross-point memory can also include memory having multiple tiers (e.g., 3D memories). These types of memories can use selector devices as part of each memory cell to select each memory cell. One type of selector device is a snapback device.

A snapback device is a thin film diode-like device having current/voltage curves that behave like diodes and can be bi-directional or uni-directional. After a voltage (e.g., selection pulse) is applied to the snapback device, the memory cell conducts abruptly, typically resulting in a spike in current. Thus the selector device (e.g., snapback device) enables the memory cell to enter more a conductive state in response to a selection pulse without necessarily having an abrupt state transition. A memory cell is defined as a combination of both the selector device (e.g., snapback device) and a memory.

The memory circuit of FIG. 1 comprises a memory cell 100 between an access line (e.g., word line) 110 and a data line (e.g., bit line) 111. A pair of transistors 114 coupled to the data line 111 is representative of a data line driver circuit 114. A pair of transistors 113 coupled to the access line 110 is representative of an access line driver circuit 113.

A transistor 130 in the access line 110 is representative of a current limiter circuit 130. A control signal WL LIM coupled to the current limiter circuit 130 is an access line limiter signal that can be used to control the current through the memory cell via the access line path 110.

A capacitance 150, 151 on the data line 111 is represented by capacitors 150, 151. A capacitance 152 on the access line 110 is represented by another capacitor 152. The capacitance 152 on the access line 110, in an embodiment, can be less than the capacitance 150, 151 on the data line. These capacitances 150, 151, 152 may be parasitic or other capacitance.

The circuit of FIG. 1 illustrates two capacitance discharge paths 160, 161 for generating the operational signals for the memory cell 100. One capacitance discharge path 160 is a deselect path for deselecting the memory cell 100 during operation. Another capacitance discharge path 161 is a select path for selecting the memory cell 100 during operation.

As an example, during a first memory operation (e.g., reset), a first of these discharge paths 160 can be used initially to create a reset current pulse to reset the memory cell 100 to a first state. During a second memory operation (e.g., set) that uses a longer pulse, a first of these discharge paths 160 can be used to generate a first portion of a set current pulse. Once the capacitance from the first discharge path 160 is discharged to a certain level, a second discharge path 161 can be switched in to discharge its capacitance to continue the current pulse. The generation of these pulses is explained in greater detail with reference to FIGS. 3 and 4, The initiation of the pulse can be accomplished through the access line, the data line, or both lines substantially simultaneously, as long as a sufficient select voltage (e.g., select pulse) has been applied to the memory cell selector device in order to "select" the memory.

Selecting the memory cell can be accomplished by a select voltage, above a predetermined threshold voltage, being applied to the select device (e.g., snapback device).

The select voltage can be provided by voltages on the data line and access line. When the select voltage is above the threshold voltage, the select device goes into a conductive state and the cell may be conductive depending on the stored datum such that less voltage is required to maintain the cell in an active state.

Deselecting the memory cell can be accomplished with a deselect operation that can be referred to as a drop-off (e.g., "hold" limit) operation. When the cell voltage (or current) goes below a certain hold limit, the memory cell selector reverts back to the high resistance state (e.g., quiescent state). These conditions are irrespective of whether the memory cell is in the 0 or 1 state (e.g., SET or RESET state). Thus, the pulse can be terminated when the voltage across the memory cell is brought below the hold limit. This can be accomplished by bringing both data line and access line voltages back to a substantially similar voltage below the hold limit voltage.

As an example of a memory operation, the select and/or the deselect paths are precharged to a predetermined voltage, depending on the operation. The precharging stores the capacitive charge on those lines. The memory cell 100 is brought into the conductive state by applying a large enough data line/access line voltage (e.g., select voltage) that is above the predetermined threshold. Once in the conductive state, the application of a current pulse for either a SET or RESET operation can be carried out using the parasitic capacitances in one or more paths (e.g., select path 161 and/or deselect path 160). The current profile can be controlled by the current limiting circuit 130 in the path with the lowest capacitance. The source of the current can be from stored charge in the parasitic capacitances (e.g., primarily data line path) and/or from lower supply voltages that may be switched in at the appropriate times. The termination of the pulse can be accomplished by reducing the data line/access line voltages below a predetermined hold limit voltage. At this point, the memory cell moves back into the quiescent state. In an embodiment, it is possible to allow the capacitance to completely discharge—assuming no supply is available to maintain current when this happens. The voltage will automatically decrease to below the hold limit voltage. One drawback to this approach is a loss of control over the current profile.

The circuit of FIG. 2 comprises an array of memory cells 250 that includes a target memory cell 200 coupled between a target access line 201 and a target data line 202. The target memory cell 200 can be accessed by signals on one or both of the target access line 201 and/or target data line 202. Access to the memory cell can be obtained through data line drivers 214 and access line drivers 213.

Each of the data line drivers 214 and the access line drivers 213 are represented by a single transistor for purposes of brevity. Each of the driver circuits can include additional transistors not shown.

Parasitic capacitance of the target data line 202 can be represented by capacitors 220, 224 that are shown coupled to the target data line path 202, 261. Additional parasitic capacitance in the access line path 201 can be represented by another capacitor 223. These capacitors 220, 223, 224 represent the node capacitance charge stored in the circuit. The capacitance charge can be the result of the charging of either the access lines and/or data lines prior to certain memory operations. In the prior art, this capacitance charge would be wasted by shorting it to ground to remove it from the circuit. The present embodiments use this capacitance charge to generate the operational signals. The capacitance may be parasitic or a capacitor.

A current limiting circuit 230 can control the current through the target memory cell 200 through the target access line path 201. The current limiting circuit 130 of FIG. 1 may also be placed in the BL path. The current limiting circuit 230 can be enabled/disabled and the current adjusted through a control signal (e.g., variable voltage) WL LIM. By choosing a particular voltage for WL LIM, the current allowed to be dissipated from the parasitic capacitance can be increased or decreased. For example, a WL LIM of 1 Volt (V) might produce a current pulse of 100 µA. A WL LIM of 1.2V might produce a 120 to pulse. These voltages and currents are for purposes of illustration only.

The circuit of FIG. 2 can provide a discharge current from multiple paths of the circuit. A first path 261 is a select path 261 that can have a first capacitive discharge. A second path (shown in FIG. 1) is a deselect path that can provide a second capacitive discharge. Thus, if one path 261 is going to be insufficient to provide enough current for an adequate operating signal, the second path can be switched into the circuit, through a transistor (e.g., driver) to provide additional current from its own stored capacitance. If the current from the additional path is also insufficient, the power supply can be switched in to the circuit to finish the operating signal.

Figure 3:
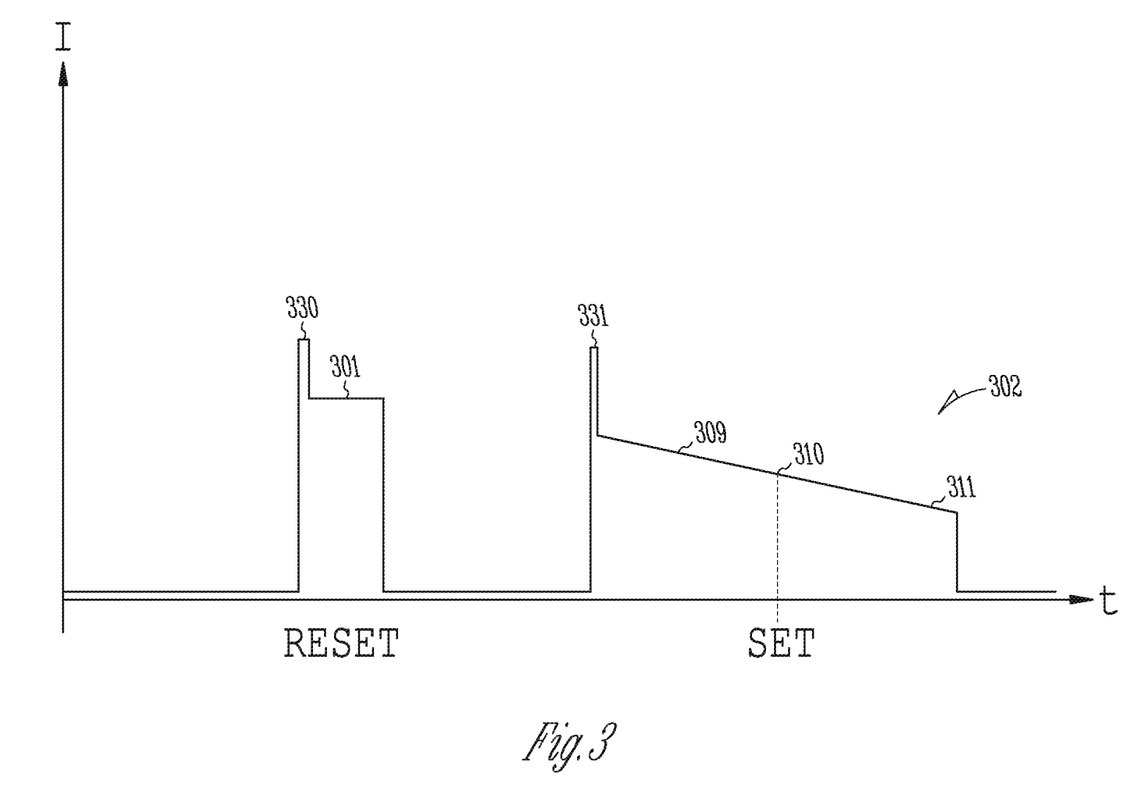
FIG. 3 illustrates a plot of an embodiment of operational signals generated by capacitive discharge.

FIG. 3 illustrates a plot of operational signals that can be generated by capacitive discharge. In the illustrated embodiment, the operational signals are reset 301 and set 302 pulses as used in resistive memory devices. However, these types of pulses can be used for other functions as well and are not limited to any particular memory use or even to use in a memory device. The pulses may also be applied in the reverse direction for one or the other operation as necessary for the memory technology.

The example reset pulse 301 is shown as being approximately 125 microAmps (µA) with a 10 nanosecond (ns) duration. Such a pulse having a relatively short duration and low current value may be generated entirely by the discharge of stored parasitic capacitance depending on the detailed implementation of the array or array size. The reset pulse can be used to place a memory cell to a particular state (e.g., logical 0 state).

The example set pulse 302 is shown as ramping from approximately 110 µA to 35 µA over a 290 ns duration. In some embodiments, such a long duration pulse might be difficult to achieve relying solely on stored parasitic capacitance. Thus, such an operational signal can be partially generated by the capacitance discharge and the remainder generated by a power supply. For example, the first portion 309 of the pulse 302 can be generated by capacitive discharge. At a predetermined transition point 310, the power supply can be connected to the control line (e.g., bit line) in order to increase a time period of the pulse 302 by generating the remaining portion 311 of the pulse.

The transition point 310 can be predetermined for each circuit using such a capacitive discharge scheme. Since a circuit's particular ability to store energy from pre-charge voltages and the usage for each pulse are known quantities, it can be determined how long of a pulse that the stored capacitance will generate and the power supply switched into the circuit at the predetermined time that the stored capacitance is ending.

Each of the pulses 301, 302 can include a current spike 330, 331 at initiation of the pulse. This is an artifact of using a snapback device and may not be present with other types of selectors. The spike magnitude may be controlled and rendered negligible by circuit techniques to reduce the parasitic capacitance on the selection path.

Figure 4:
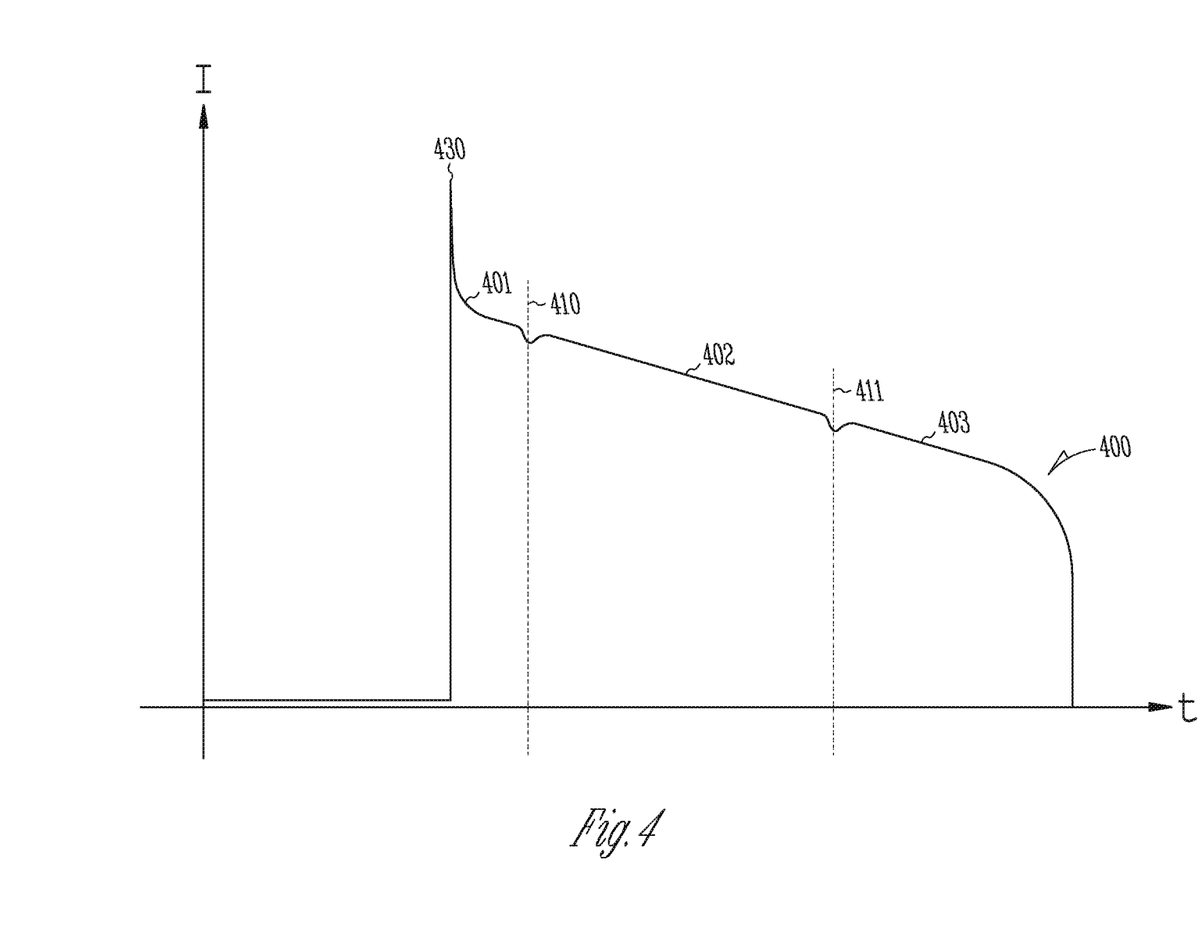
FIG. 4 illustrates a plot of another embodiment of an operational signal generated by capacitive discharge.

FIG. 4 illustrates a plot of another embodiment of an operational signal 400 that is only partly generated by capacitive discharge. This plot also shows another possible order to switching in different capacitive discharge paths as compared to the pulses of FIG. 3.

A first section 401 of the pulse 400 of FIG. 4 can be a current provided by the stored capacitance charge of a first circuit. At a first switch point 410, an intermediate power supply can be switched in to provide a current for a second section 402 of the pulse 400. At a second switch point 411, a second circuit can be switched in to provide a current for a third section 403 of the pulse 400. An initial current spike 430 might be present if a snapback selector device is used.

The order of which circuit or power supply supplies a particular section of the pulse can be predetermined by a known ability of the capacitance storage ability of certain circuits. For example, it might be known that the second circuit has a very low capacitance and can thus supply the least amount of current as compared to the other sources. This circuit can then be switched in last in order to finish off the length of the pulse. It might also be known that the first circuit has the greatest capacitance and can thus supply the greatest current (except for the power supply). In order to save power, this circuit could be switched in prior to the intermediate power supply. In other words, which circuit provides a predetermined portion of the pulse can be determined by that particular circuit's capacitance (e.g., current generation capability).

Figure 5:
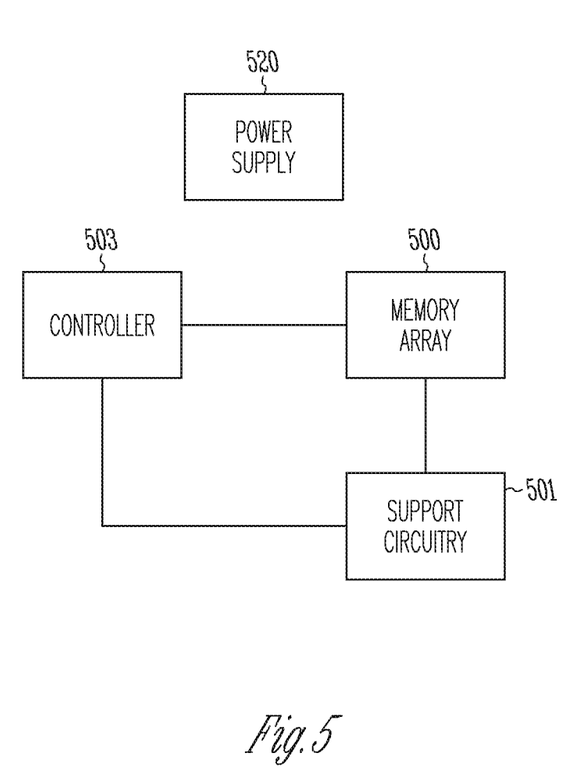
FIG. 5 illustrates a block diagram of a memory system in accordance with various embodiments.

FIG. 5 illustrates a block diagram of an embodiment of a memory device that can use various embodiments of the method for generating operational signals using capacitive discharge. The memory device is shown only for purposes of illustrating a typical electronic device that can use the various embodiments.

The memory device can include a memory array 500 coupled to support circuitry 501. A controller 503 can control operation of the memory device such as controlling the discharge of the parasitic capacitance as disclosed previously. Any of the circuits in the memory array 500 and/or the support (e.g., operational) circuitry 501 can be used to provide the capacitance that generates the operational signals from capacitive discharge. A power supply 520 can be used as discussed previously to provide the extra current for extending the time period of the operational signal. In one embodiment, the operational circuitry 501 may include elements 114, 150, 113, 130, 214, 220, 213, and 230 of FIGS. 1 and 2 as well as other circuits to drive respective control/precharge/discharge signals or the like.

In another embodiment, the block diagram of FIG. 5 can illustrate a memory system when the support circuitry 501 is combined with the memory array 500 to form a memory device. In such an embodiment, the support circuitry 501 includes a memory controller configured to control operation of the memory array 500 while the controller 503 is a processor or other controller that is separate from the memory device.

Figure 6:
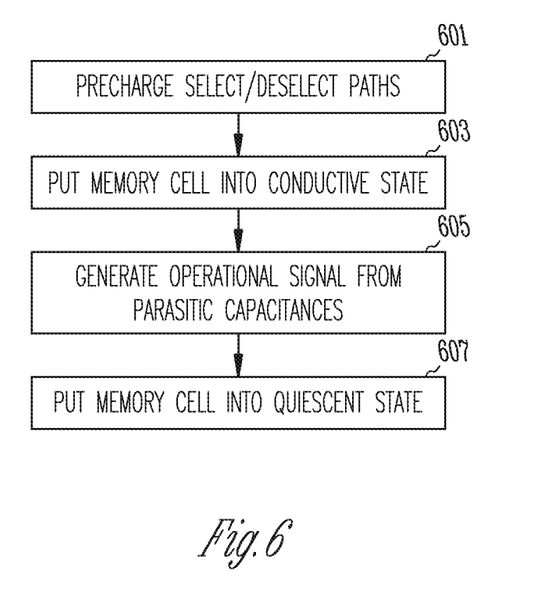
FIG. 6 illustrates a flowchart of a method for generating operational signals using capacitive discharge.

FIG. 6 illustrates a flowchart of an embodiment of a method for generating operational signals using capacitive discharge during a memory operation. The memory operation can be used in a cross-point memory device that uses a selector (e.g., snapback device) to select a memory cell.

The select/deselect paths are precharged 601 in anticipation of a memory operation. The memory cell is put into a conductive state 603 for the operation. The conductive state can be accomplished by respective voltages on the data and access lines creating a select voltage on the select device (e.g., snapback device).

The desired operational signal (e.g., set pulse, reset pulse) is generated from the parasitic capacitances 605 as described previously. In one embodiment, the set/reset pulses can be generated from capacitance discharge including parasitic capacitance charge and/or capacitor charge. The memory cell is then returned to it quiescent state 607 by reducing the select voltage below the hold voltage level. This can be accomplished by reducing the data line and access line voltages. In some embodiments, the desired operational signal is generated in different time intervals, by a multiplicity of capacitance or by a power supply (not shown).

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A variable resistance memory structure, comprising:
multiple variable resistance memory cells, the memory cells having a respective variable resistance component;
multiple word lines;
multiple bit lines, with the memory cells coupled between an individual word line and individual bit line; and
operational circuitry coupled to the multiple variable resistance memory cells, the operational circuitry including:
a first transistor configured to provide a first pulse to one of the multiple bit lines at a first time and a second pulse to the one of the multiple bit lines at a second time, later than the first time, using a first discharge path; and
a second transistor configured to provide a third pulse to the one of the multiple bit lines at a third time, later than the second time, using a second discharge path different than the first discharge path,
wherein a gate of the first transistor is coupled to a gate of the second transistor, and
wherein the first transistor is a first type and the second transistor is a second type different than the first type.

2. The memory structure of claim 1, comprising:
a controller configured to control the memory structure; and
a selector device configured to receive a select voltage and to cause the memory cells to enter a conductive state prior to providing the first and second pulses.

3. The memory structure of claim 2, wherein the selector device is a snapback device.

4. The memory structure of claim 1, wherein each of the first and second discharge paths include a respective capacitance, and
wherein the first discharge path comprises a parasitic capacitance.

5. The memory structure of claim 4, wherein the parasitic capacitance comprises one or both of an access line parasitic capacitance or a data line capacitance.

6. The memory structure of claim 1, wherein the first pulse includes a reset pulse, and wherein the second pulse includes a set pulse.

7. The memory structure of claim 1, wherein the first pulse comprises a pulse for a first memory operation signal, and
wherein the second pulse comprises a pulse for a first portion of a second memory operation signal, and the third pulse comprises a pulse for a second portion of the second memory operation signal.

8. The memory structure of claim 7, wherein the first memory operation signal is a reset operation, and
wherein the second memory operation signal is a set operation.

9. A method for a memory operation, the method comprising:
providing a first pulse to one of multiple bit lines of a variable resistance memory structure at a first time using a first transistor and a first discharge path;
providing a second pulse to the one of the multiple bit lines of the variable resistance memory structure at a second time later than the first time using the first transistor and the first discharge path; and
providing a third pulse to the one of the multiple bit lines of the variable resistance memory structure at a third time later than the second time using a second transistor and a second discharge path different than the first discharge path,
wherein a gate of the first transistor is coupled to a gate of the second transistor, and
wherein the first transistor is a first type and the second transistor is a second type different than the first type.

10. The method of claim 9, wherein providing the first and second pulses comprise using a first capacitive discharge, and
wherein providing the third pulse comprises using a second capacitive discharge.

11. The method of claim 10, wherein the first discharge includes a first parasitic capacitive discharge.

12. The method of claim 9, wherein providing the first pulse includes providing a reset pulse, and
wherein providing the second pulse includes providing a set pulse.

13. The method of claim 9, comprising:
providing a select voltage to a selector device coupled to a memory cell to cause the memory cell to enter a conductive state prior to providing the first and second pulses.

14. The method of claim 13, wherein the selector device is a snapback device.

15. The method of claim 9, wherein providing the first pulse comprises providing a pulse for a first memory operation signal,
wherein providing the second pulse comprises providing a pulse for a first portion of a second memory operation signal, and
wherein providing the third pulse comprises providing a pulse for a second portion of the second memory operation signal.

16. The method of claim 9, wherein providing the first pulse comprises providing a pulse for a reset operation,
wherein providing the second pulse comprises providing a pulse for a first portion of a set operation, and
wherein providing the third pulse comprises providing a pulse for a second portion of the set operation.

17. A method for a memory operation, the method comprising:
controlling a first transistor using a first control signal to apply a first pulse to one of multiple bit lines of a variable resistance memory structure at a first time using a first discharge path, and to apply a second pulse to one of the multiple bit lines of the variable resistance memory structure at a second time later than the first time using the first discharge path; and
controlling a second transistor using the first control signal to apply a third pulse to the one of the multiple bit lines of the variable resistance memory structure at a third time later than the second time using a second discharge path different than the first discharge path,
wherein a gate of the first transistor is coupled to a gate of the second transistor, and
wherein the first transistor is a first type and the second transistor is a second type different than the first type.

18. The method of claim 17, wherein providing the first and second pulses comprise using a first capacitive discharge, and
wherein providing the third pulse comprises using a second capacitive discharge.

19. The method of claim 18, wherein the first discharge includes a first parasitic capacitive discharge.

20. The method of claim 17, wherein providing the first pulse includes providing a reset pulse, and
wherein providing the second pulse includes providing a set pulse.

21. The method of claim 17, comprising:
providing a select voltage to a selector device coupled to a memory cell to cause the memory cell to enter a conductive state prior to providing the first and second pulses.

22. The method of claim 21, wherein the selector device is a snapback device.

23. The method of claim 21, comprising:
providing a precharge signal to a select path prior to providing the select voltage to the select path.

* * * * *